(12) United States Patent
Kimura

(10) Patent No.: US 6,774,702 B2
(45) Date of Patent: Aug. 10, 2004

(54) FUSE TRIMMING FAILURE TEST CIRCUIT FOR CMOS CIRCUIT

(75) Inventor: Ryohei Kimura, Chiba (JP)

(73) Assignee: Seiko Instruments Inc., Chiba (JP)

(*) Notice: Subject to any disclaimer, the term of this patent is extended or adjusted under 35 U.S.C. 154(b) by 0 days.

(21) Appl. No.: 10/188,685

(22) Filed: Jul. 3, 2002

(65) Prior Publication Data
US 2003/0006466 A1 Jan. 9, 2003

(30) Foreign Application Priority Data
Jul. 5, 2001 (JP) ......................................... 2001-204757

(51) Int. Cl.[7] ............................................. H01H 37/76
(52) U.S. Cl. ......................... 327/525; 327/526; 326/38
(58) Field of Search ............................... 327/525, 526, 327/270; 257/529, 530, 209; 326/13, 38; 365/96, 201, 225.7, 196; 323/354

(56) References Cited

U.S. PATENT DOCUMENTS 6,441,665 B1 * 8/2002 Hashidate et al. ........... 327/270

* cited by examiner

Primary Examiner—Timothy P. Callahan
Assistant Examiner—Hiep Nguyen
(74) Attorney, Agent, or Firm—Adams & Wilks

(57) ABSTRACT

A fuse trimming failure test circuit for a CMOS circuit includes a first MOS transistor having a source terminal connected to a negative power supply voltage and a gate terminal being connected to a first test signal terminal, a second MOS transistor having a source terminal connected to a positive power supply voltage and a gate terminal connected to a second test signal terminal, a first fuse having one end connected to the drain terminal of the first MOS transistor and a second fuse having one end connected to the drain terminal of the second MOS transistor and another end connected to another end of the first fuse.

5 Claims, 6 Drawing Sheets

FIG. 1
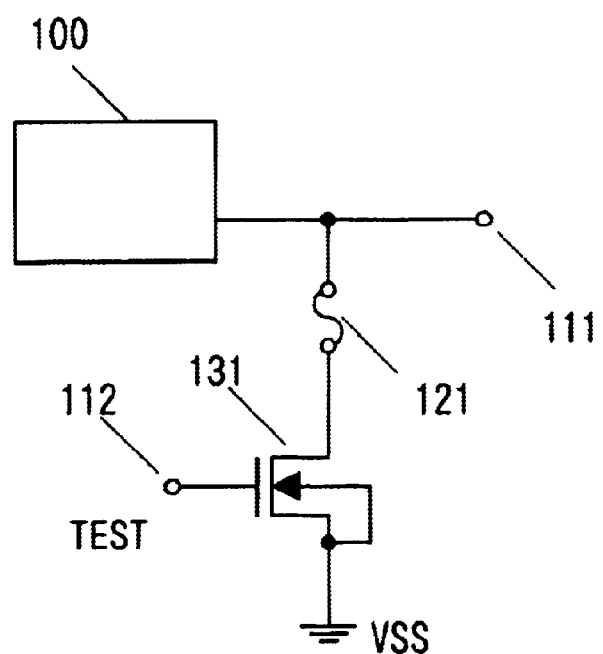
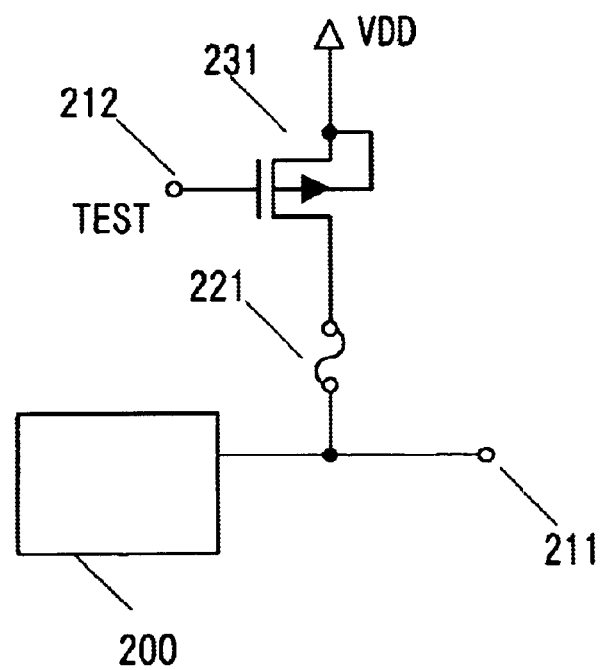
FIG. 2

FIG. 5
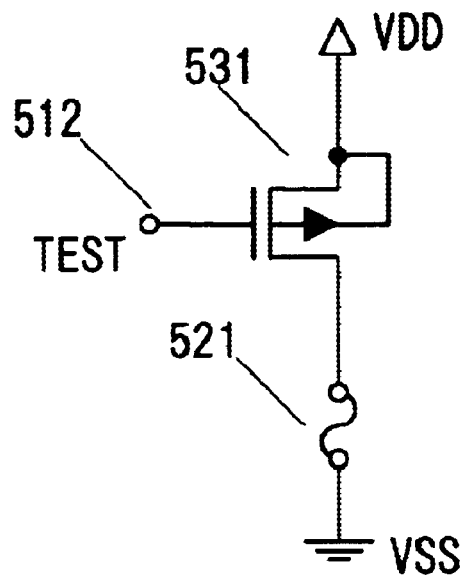
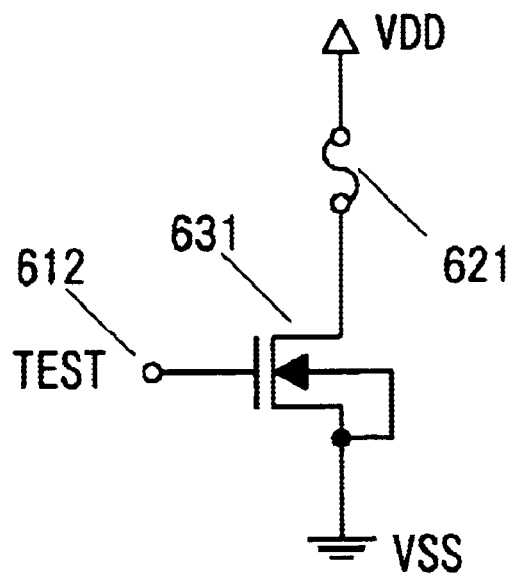
FIG. 6

FIG. 9
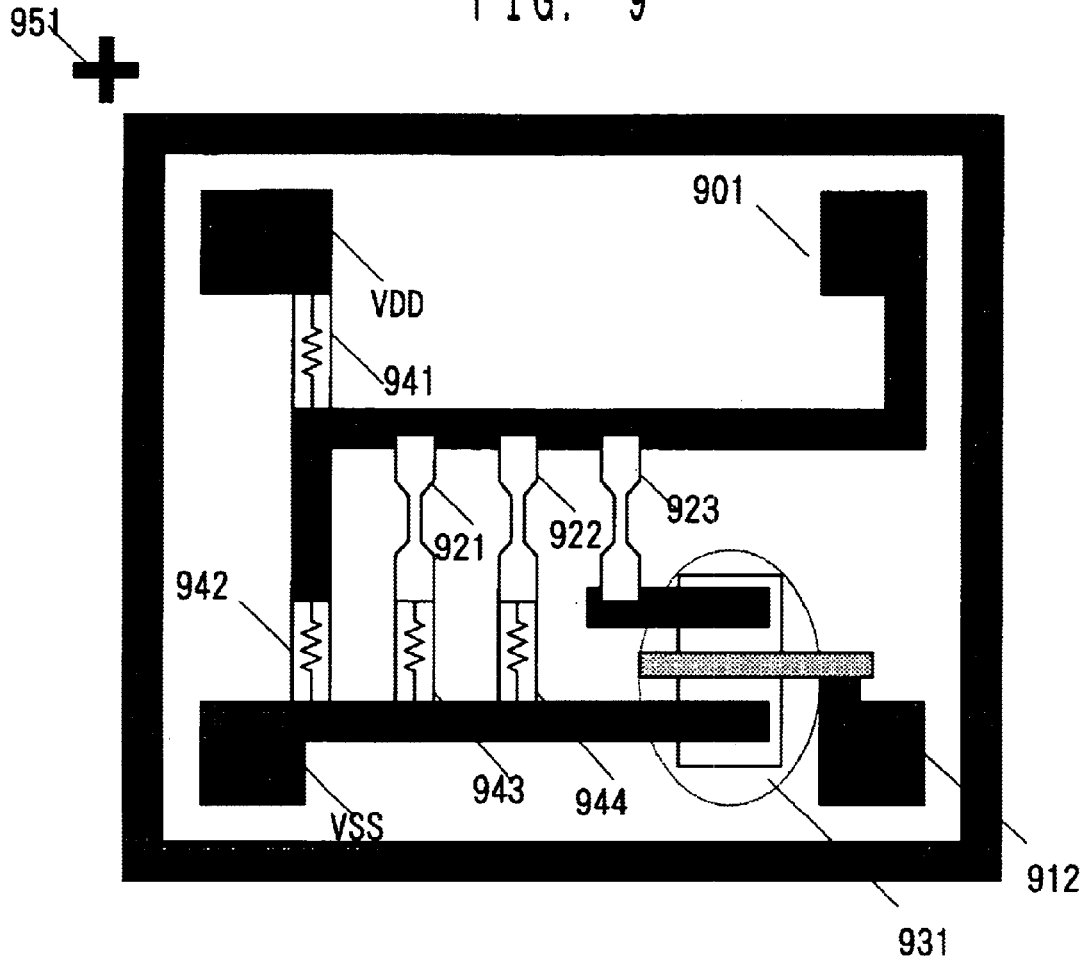
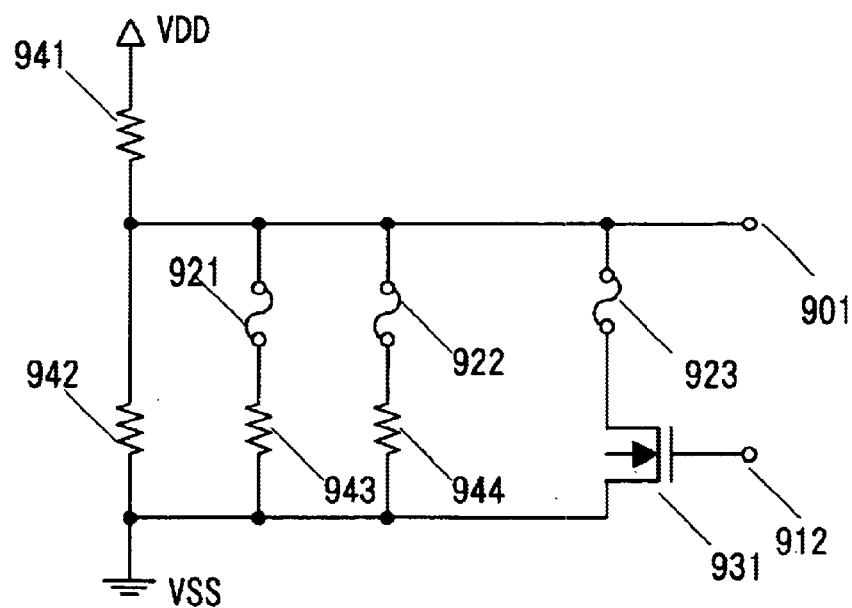
FIG. 10

US 6,774,702 B2

FUSE TRIMMING FAILURE TEST CIRCUIT FOR CMOS CIRCUIT

BACKGROUND OF THE INVENTION

1. Field of the Invention

The present invention relates to a semiconductor integrated circuit for discriminating trimming failure.

2. Description of the Related Art

An example of conventional circuit having trimming structure is shown in FIG. 8. In FIG. 8, the resistance between a terminal 811 and a negative power supply VSS corresponds to a resistance 841 by cutting a fuse 821. Further, if the fuse 821 is not cut, the resistance between the terminal 811 and the negative power supply VSS corresponds to a combined resistance of the resistance 841 and a resistance 842. A voltage of the terminal 811 of the circuit in FIG. 8 is controlled by the resistance ratio to a resistance 843.

In the conventional trimming structure, a non-conforming article is generally produced if trimming is not performed correctly. However, there is a possibility that a conforming article is nonetheless provided without performing trimming depending on a range of an efficiency voltage of a test. In this case, even if a laser is radiated to a position away from the fuse location so that trimming fails to be performed because of positional deviation of trimming alignment, or the like, a conforming article may be provided at the time of the test. In addition, there is a fear that the radiation of a laser to the wrong position affects long-term reliability of the device, and thus, the non-conforming article has to be correctly discriminated.

SUMMARY OF THE INVENTION

In order to solve the above-described problems, an object of the present invention is to provide a semiconductor integrated circuit having a structure in which a dummy fuse is used to discriminate failure in accordance with an output thereof in the case of a trimming error. The semiconductor integrated circuit as structured above has a strong point in that success or failure of trimming can be discriminated in accordance with whether the output is fixed to VSS or VDD or not. Further, such a structure is adopted in which, if trimming is not performed, short circuit is established between positive and negative power supply voltages, whereby the success or failure of trimming can be discriminated by examining a consumption current.

BRIEF DESCRIPTION OF THE DRAWINGS

In the accompanying drawings:

FIG. 1 is a structural diagram of a CMOS circuit of the present invention;

FIG. 2 is a structural diagram of a CMOS circuit of the present invention;

FIG. 5 is a structural diagram of a CMOS circuit of the present invention;

FIG. 6 is a structural diagram of a CMOS circuit of the present invention;

FIG. 9 is a layout example of a trimming mechanism of the present invention;

FIG. 10 is a circuit diagram of the trimming mechanism of the present invention.

DETAILED DESCRIPTION OF THE PREFERRED EMBODIMENTS

Figure 3:
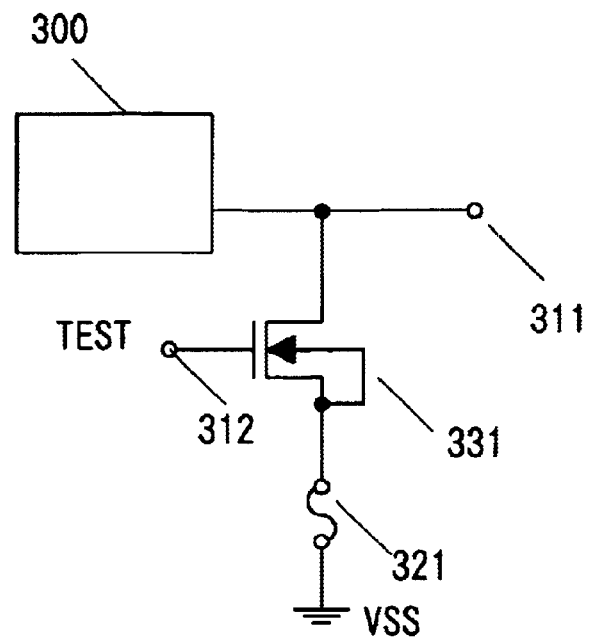
FIG. 3 is a structural diagram of a CMOS circuit of the present invention.

Hereinafter, embodiments of the present invention will be described with reference to the accompanying drawings. FIGS. 1 to 7 show examples of a structure of a CMOS circuit according to the present invention.

FIG. 1 is a diagram showing an embodiment of the present invention, in which one end of a fuse 121 is connected between an output of a CMOS circuit 100 and an output terminal 111, and another end of the fuse 121 is connected to a transistor 131. In FIG. 1, if trimming is correctly performed, the fuse 121 is cut, and a potential of the output terminal 111 is determined by the CMOS circuit 100. In the case where trimming failure occurs, when a signal is input to a test terminal 112 to make the transistor 131 conductive, the output terminal 111 is connected to a negative power supply voltage VSS via the fuse 121, and thus, the potential of the output terminal 111 becomes VSS. Therefore, a trimming error is detected.

FIG. 2 is a diagram showing another embodiment of the present invention, in which one end of a fuse 221 is connected between an output of a CMOS circuit 200 and an output terminal 211, and another end of the fuse 221 is connected to a transistor 231. In FIG. 2, if trimming is correctly performed, the fuse 221 is cut, and a potential of the output terminal 211 is determined by the CMOS circuit 200. In the case where trimming failure occurs, when a signal is input to a test terminal 212 to make the transistor 231 conductive, the output terminal 211 is connected to a positive power supply voltage VDD via the fuse 221, and thus, the potential of the output terminal 211 becomes VDD. Therefore, a trimming error is detected.

FIG. 3 is a diagram showing another embodiment of the present invention, in which a transistor 331 and a fuse 321 are connected in series between an output of a CMOS circuit 300 and an output terminal 311. In FIG. 3, if trimming is correctly performed, the fuse 321 is cut, and a potential of the output terminal 311 is determined by the CMOS circuit 300. In the case where trimming failure occurs, when a signal is input to a test terminal 312 to make the transistor 331 conductive, the output terminal 311 is connected to a negative power supply voltage VSS via the fuse 321, and thus, the potential of the output terminal 311 becomes VSS. Therefore, a trimming error is detected.

Figure 4:
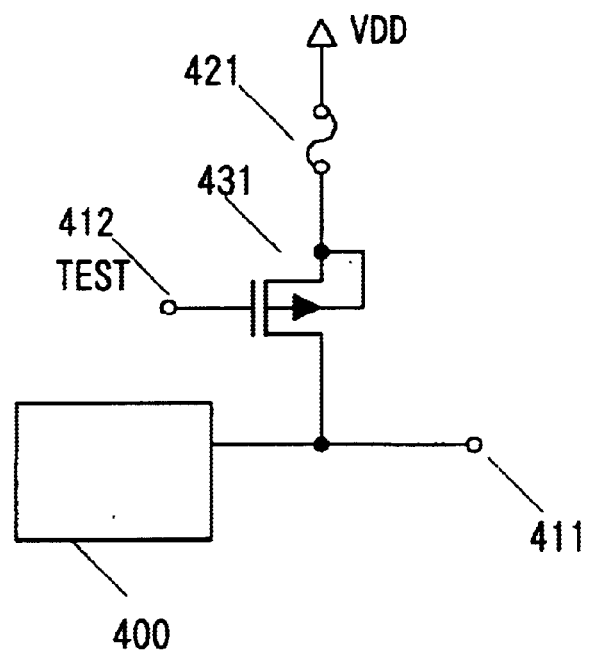
FIG. 4 is a structural diagram of a CMOS circuit of the present invention.

FIG. 4 is a diagram showing another embodiment of the present invention, in which a transistor 431 and a fuse 421 are connected in series between an output of a CMOS circuit 400 and an output terminal 411. In FIG. 4, if trimming is correctly performed, the fuse 421 is cut, and a potential of the output terminal 411 is determined by the CMOS circuit 400. In the case where trimming failure occurs, when a signal is input to a test terminal 412 to make the transistor 431 conductive, the output terminal 411 is connected to a positive power supply voltage VDD via the fuse 421, and thus, the potential of the output terminal 411 becomes VDD. Therefore, a trimming error is detected.

In FIG. 5, if trimming is correctly performed, a fuse 521 is cut, and a current does not flow through a transistor 531.

In the case where trimming failure occurs, when a signal is input to a test terminal 512 to make the transistor 531 conductive, a through current flows. Therefore, a trimming error is detected.

In FIG. 6, if trimming is correctly performed, a fuse 621 is cut, and a current does not flow through a transistor 631. In the case where trimming failure occurs, when a signal is input to a test terminal 612 to make the transistor 631 conductive, a through current flows. Therefore, a trimming error is detected.

Figure 7:
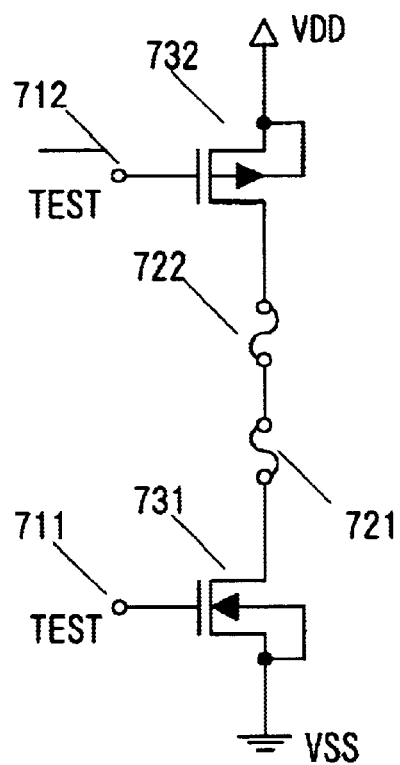
FIG. 7 is a structural diagram of a CMOS circuit of the present invention.
Figure 8:
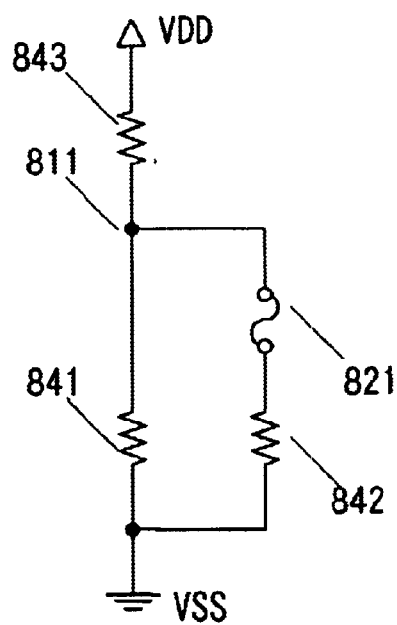
FIG. 8 shows an example of a structural diagram of a conventional trimming mechanism.

In FIG. 7, if trimming is correctly performed, a fuse 721 or a fuse 722 is cut, and a through current does not flow through opposite conductivity type transistors 731 and 732. In the case where trimming failure occurs, when signals are input to test terminals 711 and 712 to make the transistors 731 and 732 conductive, respectively, a through current flows. Therefore, a trimming error is detected.

FIG. 9 and FIG. 10 are a layout example and a circuit diagram corresponding thereto, respectively. In FIG. 9, laser trimming is conducted in accordance with an alignment mark 951. If trimming is correctly performed to main fuses 921 and 922, a fuse for error detection 923 is also necessarily cut. On the contrary, in the case where the trimming of the main fuses 921 and 922 is not correctly performed since laser trimming is not performed in accordance with the alignment mark because of the existence of impurities, or the like the fuse for error detection is not cut as wall. Therefore, a trimming error is detected.

Figure 11:
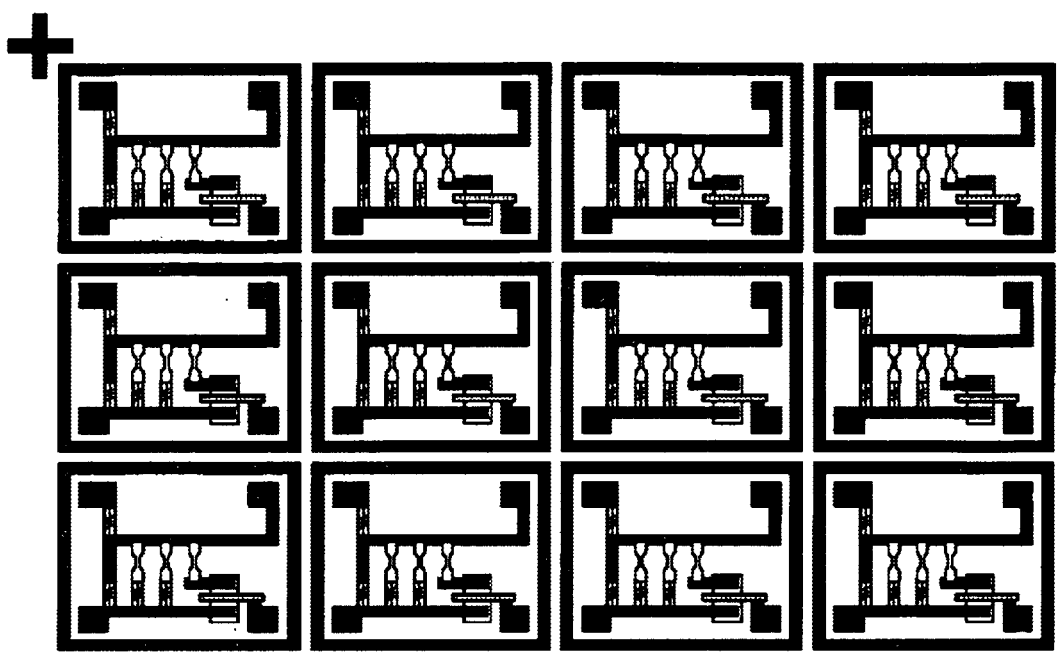
FIG. 11 is a layout example of a trimming mechanism of the present invention.

Also, in the case where positional deviation occurs when a plurality of chips are aligned with one alignment mark as shown in FIG. 11, success or failure of trimming of the main fuse is judged by the fuse for error detection.

The present invention is implemented in accordance with the embodiment described above, and provides the following effects: the output terminal voltage is fixed to the power supply voltage when trimming failure occurs; the detection of the trimming error is facilitated by flowing a large current; and thus, the discrimination of the circuit in which trimming has not been correctly performed is enabled.

What is claimed is:

1. A fuse trimming failure test circuit for a CMOS circuit, comprising: a first MOS transistor having a first source terminal, a first gate terminal, and a first drain terminal, the first source terminal being connected to a negative power supply voltage and the first gate terminal being connected to a first test signal terminal; a second MOS transistor having a second source terminal, a second gate terminal, and a second drain terminal, the second source terminal being connected to a positive power supply voltage and the second gate terminal being connected to a second test signal terminal; a first fuse having one end connected to the first drain terminal; and a second fuse having one end connected to the second drain terminal and another end connected to another end of the first fuse; wherein a fuse trimming error is indicated when current simultaneously flows through the first and second MOS transistors in response to application of test signals to the first and second test signal terminals.

2. A fuse trimming failure test circuit for a CMOS circuit according to claim 1; wherein the first and second MOS transistors have an opposite conductivity type.

3. A fuse trimming failure test circuit for a CMOS circuit having trimmable fuse elements, comprising: a first MOS transistor having a first source terminal, a first gate terminal, and a first drain terminal, the first source terminal being connected to a negative power supply voltage and the first gate terminal being connected to a first test signal terminal; a second MOS transistor having a second source terminal, a second gate terminal, and a second drain terminal, the second source terminal being connected to a positive power supply voltage and the second gate terminal being connected to a second test signal terminal; a first fuse having one end connected to the first drain terminal; and a second fuse having one end connected to the second drain terminal and another end connected to another end of the first fuse; wherein application of test signals to the first and second test signal terminals discriminates between failure and success of trimming of the trimmable fuse elements.

4. A fuse trimming failure test circuit according to claim 3; wherein a fuse trimming error is indicated when current flows from the positive power supply voltage to the negative power supply voltage when test signals are supplied to the first and second test signal terminals.

5. A fuse trimming failure test circuit according to claim 3; wherein the first and second MOS transistors have an opposite conductivity type.

* * * * *